US009395572B2

(12) United States Patent
Fujii et al.

(10) Patent No.: US 9,395,572 B2
(45) Date of Patent: Jul. 19, 2016

(54) DISPLAY APPARATUS

(71) Applicant: Sony Corporation, Tokyo (JP)

(72) Inventors: Hiroaki Fujii, Kanagawa (JP); Shinpei Nagatani, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 14/447,263

(22) Filed: Jul. 30, 2014

(65) Prior Publication Data

US 2014/0347620 A1 Nov. 27, 2014

Related U.S. Application Data

(63) Continuation of application No. 13/059,067, filed as application No. PCT/JP2009/064883 on Aug. 26, 2009, now Pat. No. 8,811,017.

(30) Foreign Application Priority Data

Aug. 27, 2008 (JP) ................................ 2008-218501

(51) Int. Cl.
H05K 7/20 (2006.01)
G02F 1/1333 (2006.01)
G02F 1/1335 (2006.01)

(52) U.S. Cl.
CPC .... G02F 1/133382 (2013.01); G02F 1/133308 (2013.01); *G02F 2001/133628* (2013.01)

(58) Field of Classification Search
None
See application file for complete search history.

(56) References Cited

U.S. PATENT DOCUMENTS

| 5,971,566 A * | 10/1999 | Tani | H05K 7/20972 313/46 |
| 6,181,071 B1 * | 1/2001 | Yuuki | G02F 1/133615 315/169.3 |
| 2006/0061945 A1 | 3/2006 | Kim | |
| 2006/0098398 A1* | 5/2006 | Kim | G06F 1/1601 361/679.22 |
| 2006/0176416 A1 | 8/2006 | Ikeda | |
| 2006/0243948 A1 | 11/2006 | Ishiwa | |
| 2006/0268511 A1 | 11/2006 | Jeong | |
| 2007/0046852 A1 | 3/2007 | Kim et al. | |

(Continued)

FOREIGN PATENT DOCUMENTS

| CN | 1920625 A | 2/2007 |
| CN | 101021634 A | 8/2007 |

(Continued)

OTHER PUBLICATIONS

Japanese Office Action for JP Application No. 2013271518, dated Mar. 31, 2015.

(Continued)

*Primary Examiner* — Courtney Smith
(74) *Attorney, Agent, or Firm* — Lerner, David, Littenberg, Krumholz & Mentlik, LLP

(57) ABSTRACT

Provided is a display apparatus including a display panel for displaying an image, a heat source arranged at a side surface of at least one side of the display panel, a heat absorbing section for absorbing heat generated by the heat source, a back surface plate arranged at a back surface side of the display panel and made of a metal, a portion of the back surface plate being in close contact with the heat absorbing section, a front surface plate arranged at a front surface side of the display panel and made of a metal, and a middle chassis arranged between the front surface plate and the heat absorbing section.

15 Claims, 16 Drawing Sheets

(56) References Cited

U.S. PATENT DOCUMENTS

| | | | | |
|---|---|---|---|---|
| 2007/0189042 | A1* | 8/2007 | Pai | G02F 1/133603 362/632 |
| 2007/0258199 | A1* | 11/2007 | Jeong | G06F 1/1601 361/679.01 |
| 2008/0180972 | A1* | 7/2008 | Sakamoto | G02B 6/009 362/613 |
| 2009/0033221 | A1* | 2/2009 | Lee | H05K 7/20963 313/582 |
| 2011/0109834 | A1* | 5/2011 | Itoh | G02B 6/0021 349/61 |

FOREIGN PATENT DOCUMENTS

| JP | U 3039372 | 7/1997 |
|---|---|---|
| JP | 2006113657 A | 4/2006 |
| JP | 2006-163101 | 6/2006 |
| JP | 2006-195296 | 7/2006 |
| JP | 2006208723 A | 8/2006 |
| JP | 2006-235653 | 9/2006 |
| JP | 2006-267936 | 10/2006 |
| JP | 2006-340029 | 12/2006 |
| JP | 2007-178148 | 7/2007 |
| JP | 2007-248820 | 9/2007 |
| JP | 2007-328281 | 12/2007 |
| JP | 2008-020557 | 1/2008 |
| JP | 2008-158307 | 7/2008 |
| JP | 2008-165101 | 7/2008 |
| JP | 2008-186780 | 8/2008 |

OTHER PUBLICATIONS

Communication issued by the Japanese Patent Office on Sep. 16, 2014 for Japanese Application No. 2013-271518, 7 pages.

International Search Report for Application No. PCT/JP2009/064883 dated Nov. 17, 2009.

Korean Office Action for KR Application No. 20117002926, dated May 21, 2015.

Chinese Patent Office Action for Application No. 20140142690.4 Dated Feb. 1, 2016.

* cited by examiner

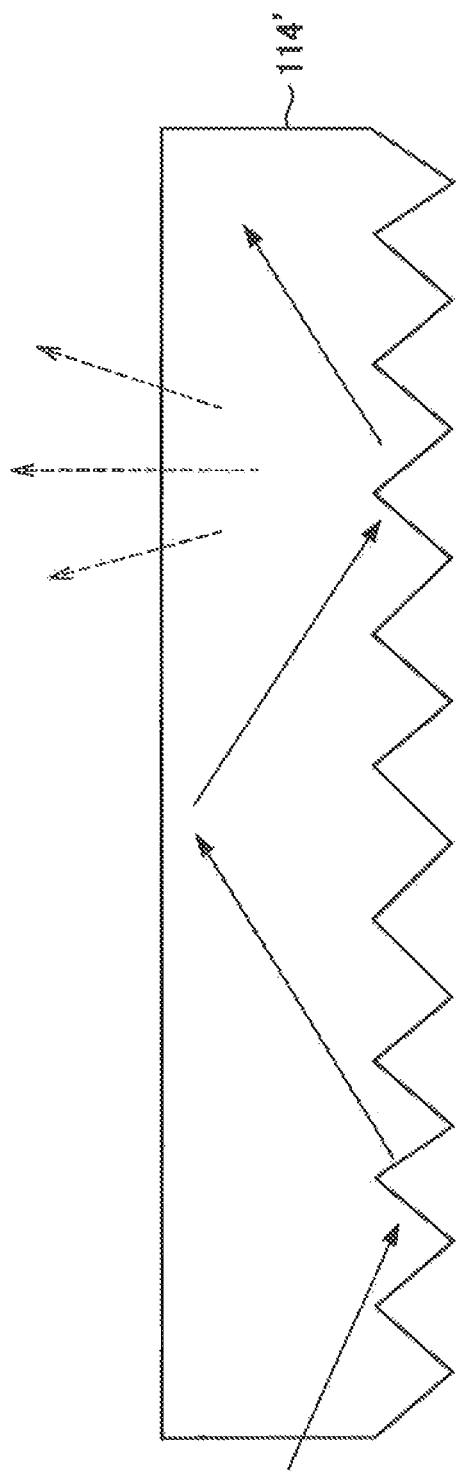

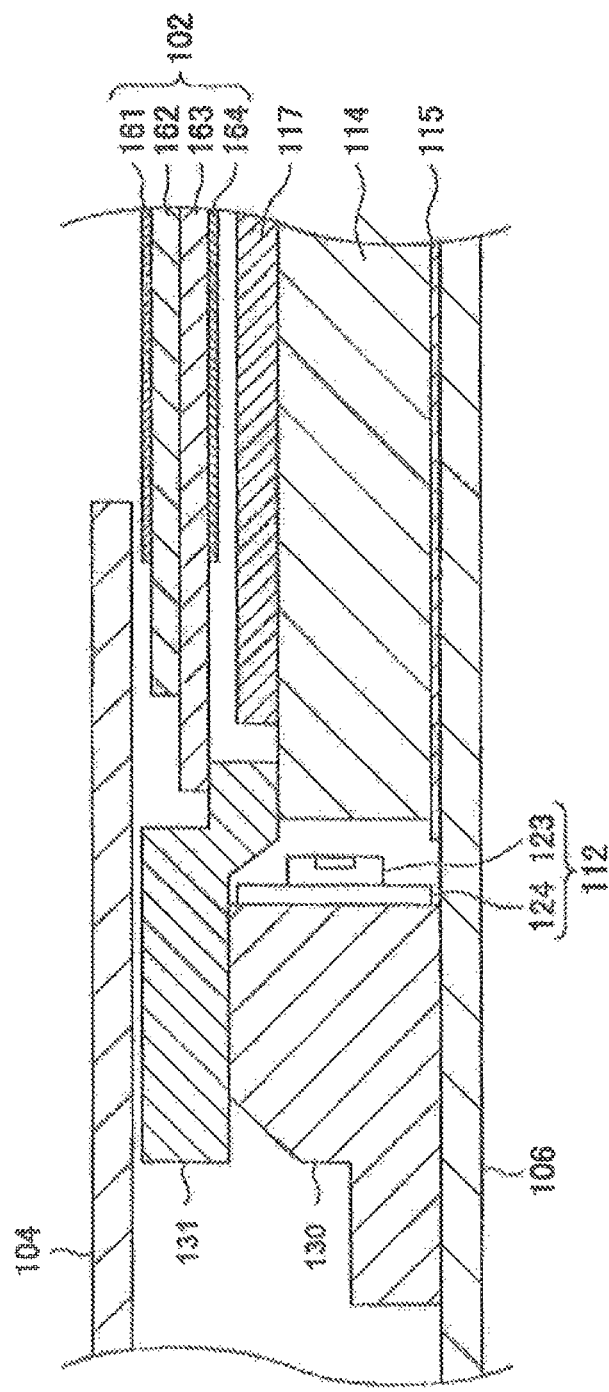

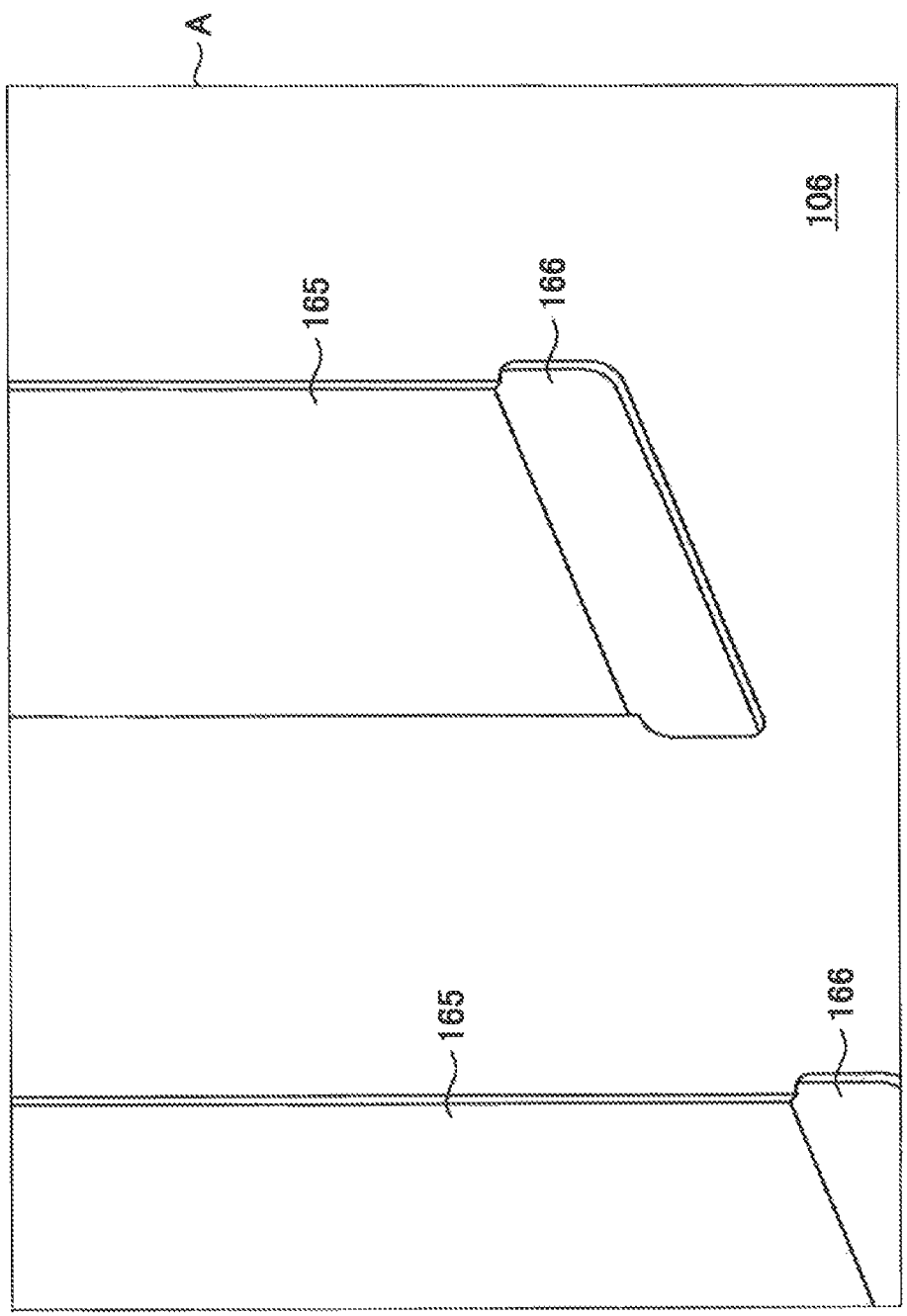

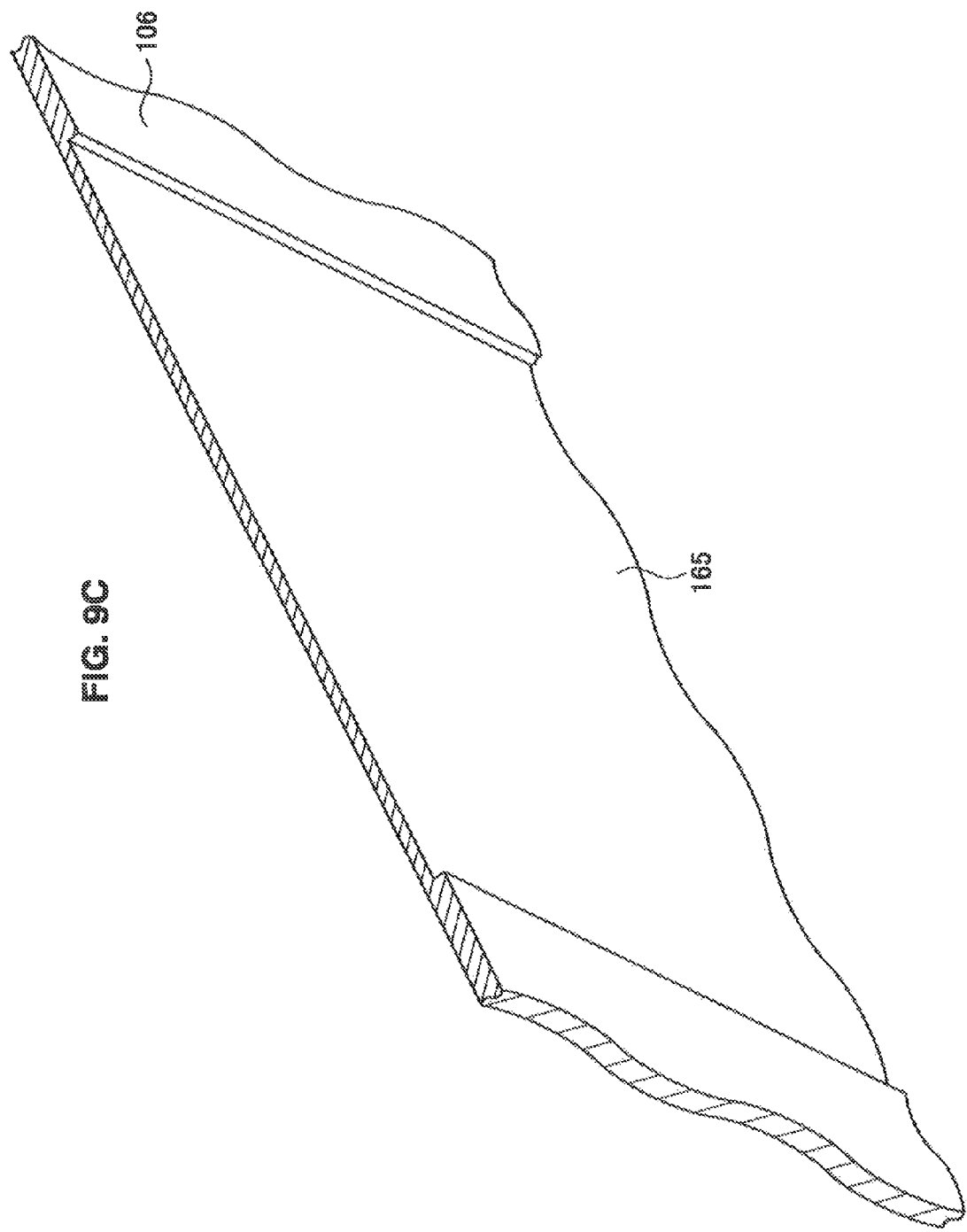

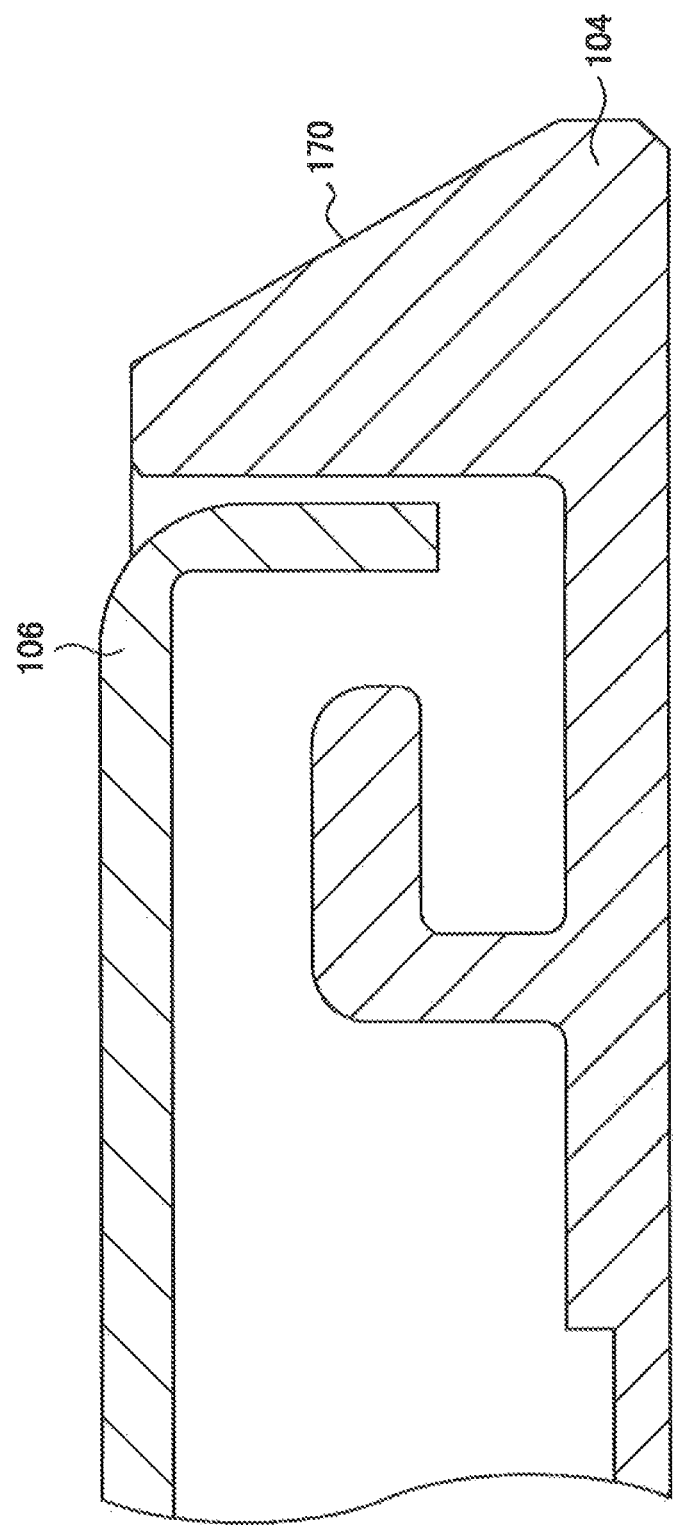

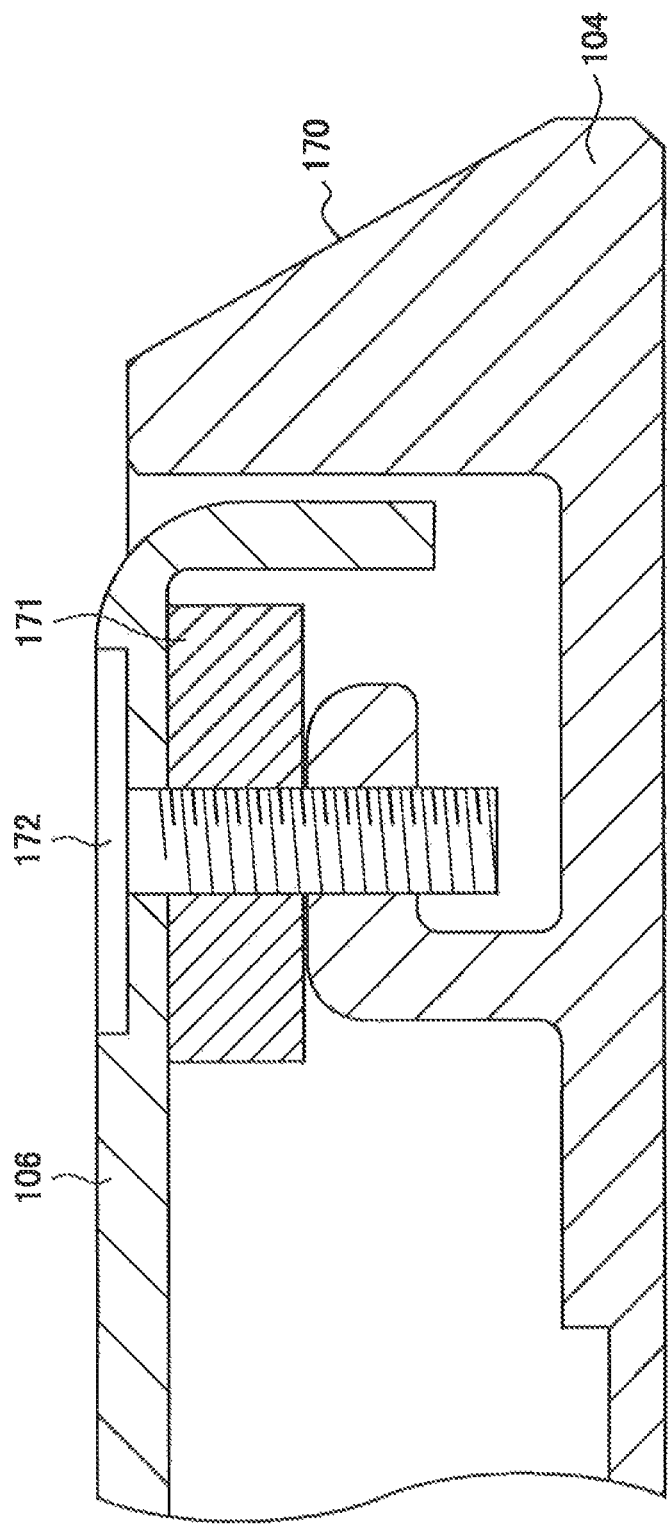

US 9,395,572 B2

DISPLAY APPARATUS

CROSS-REFERENCE TO RELATED APPLICATIONS

This application is a continuation of and claims priority to U.S. patent application Ser. No. 13/059,067, filed Feb. 15, 2011 (now pending), which is a national phase of International Application No. PCT/JP2009/064883, filed Aug. 26, 2009, which claims priority to Japanese Patent Application No. 2008-218501, filed Aug. 27, 2008 in Japan. Each of the above-mentioned applications is expressly incorporated herein by reference in its entirety.

TECHNICAL FIELD

The present invention relates to a display apparatus.

BACKGROUND ART

A liquid crystal display (LCD: Liquid Crystal Display) arranged in a liquid crystal display apparatus in the related art includes, e.g., a liquid crystal panel having a color filter substrate colored in red, green, and blue, a liquid crystal layer, and the like, and a backlight arranged at a back surface side of the liquid crystal panel.

In the liquid crystal display apparatus, voltages are changed to control twists of liquid crystal molecules in the liquid crystal layer, and white light emitted by the backlight passes through the liquid crystal layer according to the twists of the liquid crystal molecules, and then passes through the color filter colored in respective colors. Since the white light emitted by the backlight passes through the color filter, the white light is colored in red, green, and blue, whereby an image is displayed.

In the past, CCFL (Cold Cathode Fluorescent Lighting) has been used as a light source for a backlight in an LCD incorporated into a liquid crystal display apparatus and other electronic equipment. Recently, an LED (Light Emitting Diode) is regarded as a promising light source in place of this CCFL. When the LED is used, a higher efficiency and a higher color gamut can be achieved.

In an LCD in the related art, a backlight is arranged at a back surface side of a liquid crystal panel. Therefore, it used to be difficult to reduce the thickness of the LCD. Accordingly, a liquid crystal display apparatus has been developed, in which light sources such as LEDs are arranged along each side of a liquid crystal panel, instead of arranging the backlight at the back surface side of the liquid crystal panel, in order to make the apparatus thinner, and wherein lights of the light sources are emitted from side surfaces of the liquid crystal panel and are reflected and diffused to emit white light onto the liquid crystal panel (for example, see Patent Literature 1 and Patent Literature 2). Since the light sources are arranged at positions along each side of the liquid crystal panel, this apparatus can be made thinner than the apparatus in which the backlight is arranged at the back surface side of the liquid crystal panel.

Recently, a display apparatus has been suggested, in which LEDs emitting lights of three primary colors, i.e., red, blue, and green, are used as light sources, and the lights are emitted from side surfaces of a liquid crystal panel, so that the LEDs function as a backlight (for example, see Patent Literature 3).

CITATION LIST

Patent Literature

Patent Literature 1: JP 2007-328281 (A)
Patent Literature 2: JP 2007-248820 (A)
Patent Literature 3: JP 2006413657 (A)

SUMMARY OF INVENTION

Technical Problem

However, when the light sources are arranged along each side of the liquid crystal panel, the temperature increases at parts close to a peripheral portion of the liquid crystal panel due to the heat generated by the light sources. This rise of the temperature may adversely affect the operation of the liquid crystal display apparatus. Therefore, it is necessary to effectively diffuse the heat generated by the light sources.

However, when a fan is arranged in a liquid crystal display apparatus order to effectively diffuse the heat generated by the light sources, there is an issue in that electric power for driving the fan is necessary, and the fan makes it difficult to reduce the thickness of the apparatus. Alternatively, a method is suggested to arrange heat radiation fins, in place of the fan, in the liquid crystal display apparatus in order to effectively diffuse the heat generated by the light sources. However, even when the heat radiation fins are arranged in the liquid crystal display apparatus, it is nonetheless difficult to reduce the thickness of the apparatus.

The present invention is made in view of the above-mentioned issue, and aims to provide a novel and improved display apparatus which can effectively discharge heat generated by a heat source when the heat source is arranged at a side surface of at least one side of a display panel.

Solution to Problem

According to an aspect of the present invention in order to achieve the above-mentioned object, there is provided a display apparatus including: a display panel for displaying an image; a heat source arranged at a side surface of at least one side of the display panel; a heat absorbing section for absorbing heat generated by the heat source; a back surface plate arranged at a back surface side of the display panel and made of a metal, wherein a portion of the back surface plate is in close contact with the heat absorbing section; a front surface plate arranged at a front surface side of the display panel and made of a metal; and a middle chassis arranged between the front surface plate and the heat absorbing section.

According to such configuration, the display panel displays an image, the heat source is arranged at a side surface of at least one side of the display panel, and a heat absorbing section absorbs heat generated by the heat source. A back surface plate is arranged on the back surface side of the display panel and is made of a metal, wherein a portion of the back surface plate is in close contact with the heat absorbing section. A front surface plate is arranged on the front surface side of the display panel and is made of a metal. A middle chassis is arranged between the front surface plate and the heat absorbing section. As a result, the heat generated by the heat source is absorbed by the heat absorbing section, and the heat absorbed by the heat absorbing section can be effectively diffused from the front surface plate and the back surface plate.

The middle chassis may be made of a material having a thermal conductivity lower than a thermal conductivity of the heat absorbing section.

The display apparatus may further include a panel control board for controlling drive of the display panel, and the panel control board may be located at a central portion of the back surface side of the back surface plate.

The display apparatus may further include: a panel driver board for controlling display of an image on the display panel; and a flexible board for connecting the panel control board and the panel driver board, and the back surface plate may have a recessed portion, having an indentation corresponding to a width, a length, and a thickness of the flexible board, to place the flexible boards therein.

A peripheral portion of the front surface plate may have a tapered portion extending from the front surface side to the back surface side so as to make the back surface side smaller.

The display apparatus may further include: the heat source emitting a visible light; and a light radiation unit for diffusing the light emitted by the heat source to radiate the diffused light onto the display panel, thus displaying an image on the display panel.

Advantageous Effects of Invention

As described above, the present invention provides a novel and improved display apparatus which can effectively diffuse heat generated by a heat source such as an LED when the heat source is arranged at aside surface of at least one side of a display panel.

BRIEF DESCRIPTION OF DRAWINGS

FIG. 7 is an explanatory diagram illustrating an optical waveguide 114' having a reflecting shape formed on a back surface side.

FIG. 8 is an explanatory diagram illustrating a cross sectional diagram of a configuration of a heat radiation structure for radiating heat generated by the light sources 112.

FIG. 9B is an explanatory diagram illustrating a shape of the rear cover 106 in the liquid crystal display apparatus 100 according to an embodiment of the present invention.

FIG. 9C is an explanatory diagram illustrating a shape of the rear cover 106 in the liquid crystal display apparatus 100 according to an embodiment of the present invention.

FIG. 10B is an explanatory diagram illustrating cross sectional shapes of the front bezel 104 and the rear cover 106 in the liquid crystal display apparatus 100 according to an embodiment of the present invention.

FIG. 10C is an explanatory diagram illustrating cross sectional shapes of the front bezel 104 and the rear cover 106 in the liquid crystal display apparatus 100 according to an embodiment of the present invention.

Figure 1:
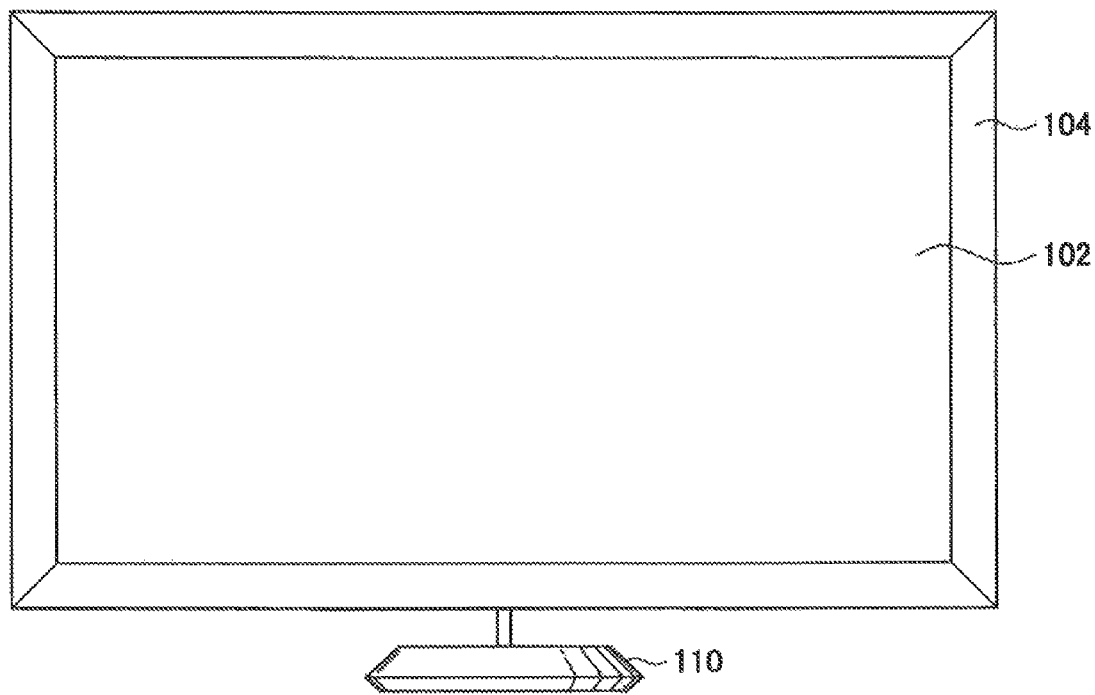
FIG. 1 is an explanatory diagram illustrating a front surface of a liquid crystal display apparatus 100 according to an embodiment of the present invention.

REFERENCE SIGNS LIST 100 liquid crystal display apparatus
102 display panel
104 front bezel
106 rear cover
108 chassis
110 stand
112 light source
114 optical waveguide
115 reflecting plate
117 optical sheet
121 liquid crystal cell
122 panel driver board
123 LED
124 LED circuit board
130 heat sink
131 middle chassis
151 panel control board
153 signal board
154 power supply board
155 LED driver board
156 flexible board
161 polarization plate
162 glass substrate
163 glass substrate
164 polarization plate
165 recessed portion
170 tapered portion
171 screw
172 spacer
181, 182 connector
183 cover
184 arm section

DESCRIPTION OF EMBODIMENTS

Hereinafter, preferred embodiments of the present invention will be described in detail with reference to the appended drawings. Note that, in this specification and the drawings, elements that have substantially the same function and structure are denoted with the same reference signs, and repeated explanation is omitted.

A preferred embodiment of the present invention will be explained in detail in the order listed below.

[1] Explanation about a liquid crystal display apparatus according to an embodiment of the present invention

[2] Explanation about heat radiation structure in a liquid crystal display apparatus according to an embodiment of the present invention

[3] Explanation about structure of a liquid crystal display apparatus according to an embodiment of the present invention

[4] Conclusion

[1] EXPLANATION ABOUT A LIQUID CRYSTAL DISPLAY APPARATUS ACCORDING TO AN EMBODIMENT OF THE PRESENT INVENTION

Figure 2:
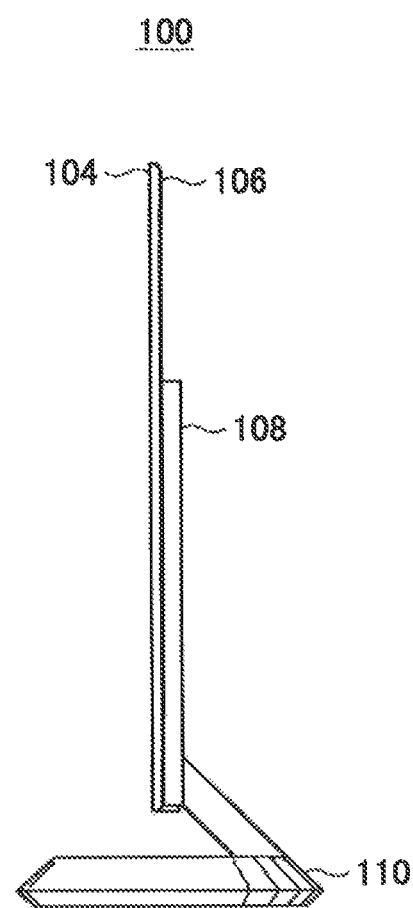
FIG. 2 is an explanatory diagram illustrating a side surface of the liquid crystal display apparatus 100 according to an embodiment of the present invention.

First, an external appearance of a liquid crystal display apparatus according to an embodiment of the present invention will be explained. FIG. 1 is an explanatory diagram illustrating a front surface of the liquid crystal display apparatus 100 according to an embodiment of the present invention. FIG. 2 is an explanatory diagram illustrating a side surface of the liquid crystal display apparatus 100 according to the embodiment of the present invention. The external appearance of the liquid crystal display apparatus 100 according to the embodiment of the present invention will be hereinafter explained with reference to FIGS. 1 and 2.

The liquid crystal display apparatus 100 is an example of a display apparatus according to the present invention. In the liquid crystal display apparatus 100, light is emitted onto a display panel having a liquid crystal layer, and voltages are applied to liquid crystal molecules in the liquid crystal layer to change the orientations of the liquid crystal molecules, thereby achieving optical shutters. Thus, the liquid crystal display apparatus 100 displays an image. As shown in FIGS. 1 and 2, the liquid crystal display apparatus 100 according to the embodiment of the present invention includes a display panel 102, a front bezel 104, a rear cover 106, a chassis 108, and a stand 110. In the below explanation, a side of the liquid crystal display apparatus 100 at the front bezel 104 is referred to as a front surface side, and a side of the liquid crystal display apparatus 100 at the rear cover 106 is referred to as a back surface side.

The display panel 102 displays a motion image or a still image (which are collectively, simply referred to as "image"). The display panel 102 includes a liquid crystal layer in which liquid crystal molecules are sealed, a glass substrate for applying voltages to the liquid crystal molecules, polarization plates for polarizing white light emitted by light sources, and a color filter for coloring the white light emitted through the polarization plates.

Usually, two glass substrates are used. The glass substrate on the back surface side is formed with signal lines and scanning lines arranged in a matrix form, thin-film transistors serving as switching devices arranged at intersecting point between the signal lines and the scanning lines, and pixel electrodes. On the other hand, the glass substrate on the front surface side is formed with a counter electrode and a color filter. A liquid crystal layer in which, for example, twisted nematic (TN) liquid crystals are sealed, is arranged between the two glass substrates. It is to be understood that the display panel 102 is not limited to the above configuration. The display panel 102 may be various kinds of liquid crystal panels which have been provided in the past. The configuration of the display panel 102 according to the present embodiment will be explained later in detail.

The front bezel 104 is an example of a front surface plate according to the present invention. The front bezel 104 is a frame arranged at the front surface side of the display panel 102 for fixing the display panel 102. The front bezel 104 is arranged with an opening portion, through which viewers can watch images displayed by the display panel 102.

The rear cover 106 is an example of a back surface plate according to the present invention. The rear cover 106 is a cover arranged at the back surface side of the display panel 102 for fixing the display panel 102. The chassis 108 is arranged at the back surface side of the rear cover 106, and various kinds of boards for driving the display panel 102 are mounted on the chassis 108.

The front bezel 104 and the rear cover 106 are formed with a metal having a high thermal conductivity such as aluminum. Since the front bezel 104 and the rear cover 106 are formed with the metal, the front bezel 104 and the rear cover 106 can shield electromagnetic wave generated by various circuits and electronic components arranged in the liquid crystal display apparatus 100. Therefore, the front bezel 104 and the rear cover 106 can reduce unwanted emissions from various circuits and electronic components arranged in the liquid crystal display apparatus 100.

The front surface side of the front bezel 104 may be treated with alumite. When the front surface side of the front bezel 104 is treated with alumite, the front surface side of the front bezel 104 becomes more resistant to corrosion, and can produce a more metallic appearance. The back surface side of the rear cover 106 may be coated with rubber.

The stand 110 is a stand for fixing and installing the liquid crystal display apparatus 100. The stand 110 is adapted to be coupled with the chassis 108. In the liquid crystal display apparatus 100 according to the present embodiment, the chassis 108 can be fixed to the stand 110, and the chassis 108 can be fixed to a wall upon detaching the chassis 108 from the stand 110. Therefore, the chassis 108 is arranged with a fastening section for fixing the chassis 108 to the wall.

A speaker may be incorporated into the stand 110 although it is not shown in FIGS. 1 and 2. When the speaker is incorporated into the stand 110, sounds are output from the stand 110.

The external appearance of the liquid crystal display apparatus 100 according to the embodiment of the present invention has been hereinabove explained. Subsequently, the configuration of the liquid crystal display apparatus 100 according to the embodiment of the present invention will be explained.

Figure 3:
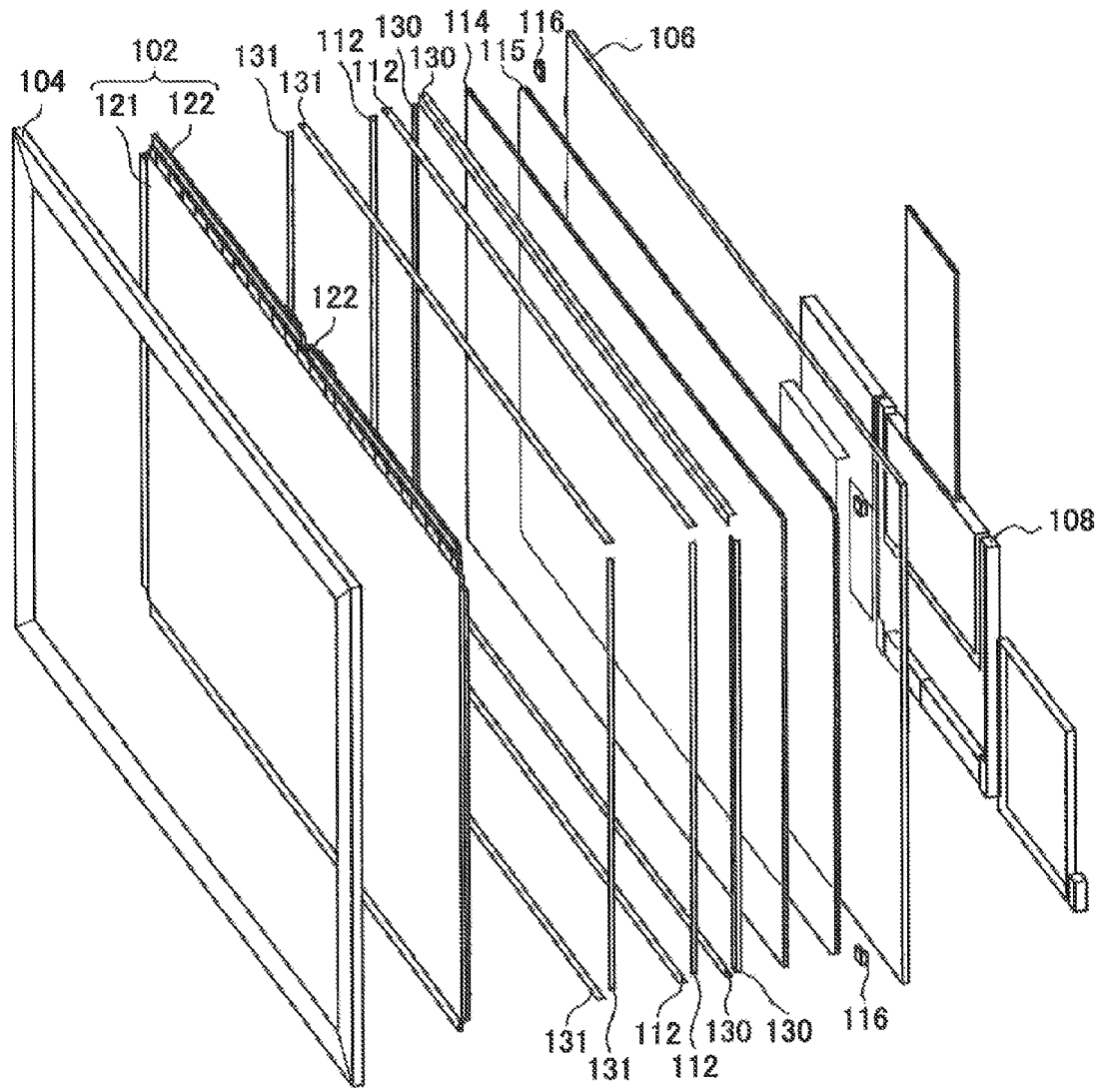
FIG. 3 is an exploded perspective view illustrating the liquid crystal display apparatus 100 according to an embodiment of the present invention.

FIG. 3 is an exploded perspective view illustrating the liquid crystal display apparatus 100 according to the embodiment of the present invention. The configuration of the liquid crystal display apparatus 100 according to the embodiment of the present invention will be explained with reference to FIG. 3.

As shown in FIG. 3, the liquid crystal display apparatus 100 according to the embodiment of the present invention includes the front bezel 104, the rear cover 106, the chassis 108, the display panel 102, light sources 112, heat sinks 130, an optical waveguide 114, a reflecting plate 115, and middle chassis 131. The display panel 102 includes a liquid crystal cell 121 and panel driver board 122.

As shown in FIG. 3, the light sources 112 are arranged at positions along four sides of the display panel 102. For example, white LEDs emitting white lights may be used as the light sources 112. Alternatively, LEDs emitting lights of three primary colors, i.e., red, blue, green, may be used. Still alternatively, light emitting devices other than LEDs may be used as the light sources 112. In the below explanation, a case will be explained where white LEDs are used as the light sources 112.

The white lights emitted by the light sources 112 arranged along four sides of the display panel 102 are diffused by the optical waveguide 114, and are reflected by the reflecting plate 115. Thus, the white lights are uniformly emitted to the display panel 102. The optical waveguide 114 is arranged at the back surface side of the display panel 102. For example, the optical waveguide 114 may be integrally formed by die forming of silicone rubber resin.

A silicone rubber resin material may be used as a material of the optical waveguide 114. The silicone rubber resin material having a performance equivalent to or more than a performance of poly carbonate resin (PC) or an acrylic resin (polymethyl methacrylate (PMMA)) of transparent thermoplastic resin which are conventionally used in view of high degree of transparency, formability, low water-absorbing property (low moisture absorption characteristics), environment resistance, and low birefringence. Examples of silicone rubber resin materials include polydimethylsiloxane (PDMS), polyalkylalkenylsiloxane, and polyalkylphenylsiloxane. Therefore, the transparency and the refractive index of the optical waveguide 114 become appropriate. As a result, the light guiding function of the optical waveguide 114 becomes superior. In particular, the constituent material is more preferably polydimethylsiloxane (PDMS). In this case, the optical waveguide 5 becomes transparent, and the refractive index attains 14 or more, whereby the light guiding function becomes superior to an optical waveguide in the related art.

The optical waveguide 114 diffuses the white lights emitted by the light sources 112 arranged at the four sides as described above, and emits the diffused white lights to the display panel 102. As described above, in the liquid crystal display apparatus 100 according to the present embodiment, the light sources 112 emit the lights from side surfaces of the optical waveguide 114.

When LEDs emitting lights of three primary colors, i.e., red, blue, green, are used as the light sources 112, the optical waveguide 114 may be configured to mix the lights emitted by the LEDs and emit the mixed lights as the white light onto the display panel 102.

As shown in FIG. 3, the back surface side of the optical waveguide 114 is arranged with a reflecting plate 115. The front surface side of the optical waveguide 114 is arranged with an optical sheet although it is not shown in FIG. 3. In the liquid crystal display apparatus 100 according to the present embodiment, a diffusion material is printed on the back surface side of the optical waveguide 114. The diffusion material printed on the back surface side of the optical waveguide 114 diffuses the lights emitted by the light sources 112, and the diffused light is emitted onto the display panel 102.

The liquid crystal cell 121 has such a structure that the liquid crystal layer is sealed between two glass substrates, and the two glass substrates are sealed by polarization plates. The orientation states of the liquid crystal layer sealed into the liquid crystal cell 121 are changed by applying voltages with the panel driver board 122. Thus, the liquid crystal cell 121 can pass and shield the lights emitted by the light sources 112.

The middle chassis 131 is a member arranged between the front bezel 104 and the heat sinks 130. The middle chassis 131 may be formed with a material having a thermal conductivity lower than that of a metal, for example, a synthetic resin. The functions of the middle chassis 131 arranged between the front bezel 104 and the heat sinks 130 will be explained later in detail.

In FIG. 3, the light sources 112 are arranged at positions along four sides of the display panel 102. However, in the present invention, the arrangement of the light sources 112 is not limited to such an example. The light source 112 may be arranged on one side of the display panel 102. Alternatively, the light sources 112 may be arranged on two or three sides thereof.

The configuration of the liquid crystal display apparatus 100 according to the embodiment of the present invention has been explained hereinabove with reference to FIG. 3. Subsequently, an overview of an arrangement of boards in the liquid crystal display apparatus 100 according to the embodiment of the present invention will be explained.

Figure 4:
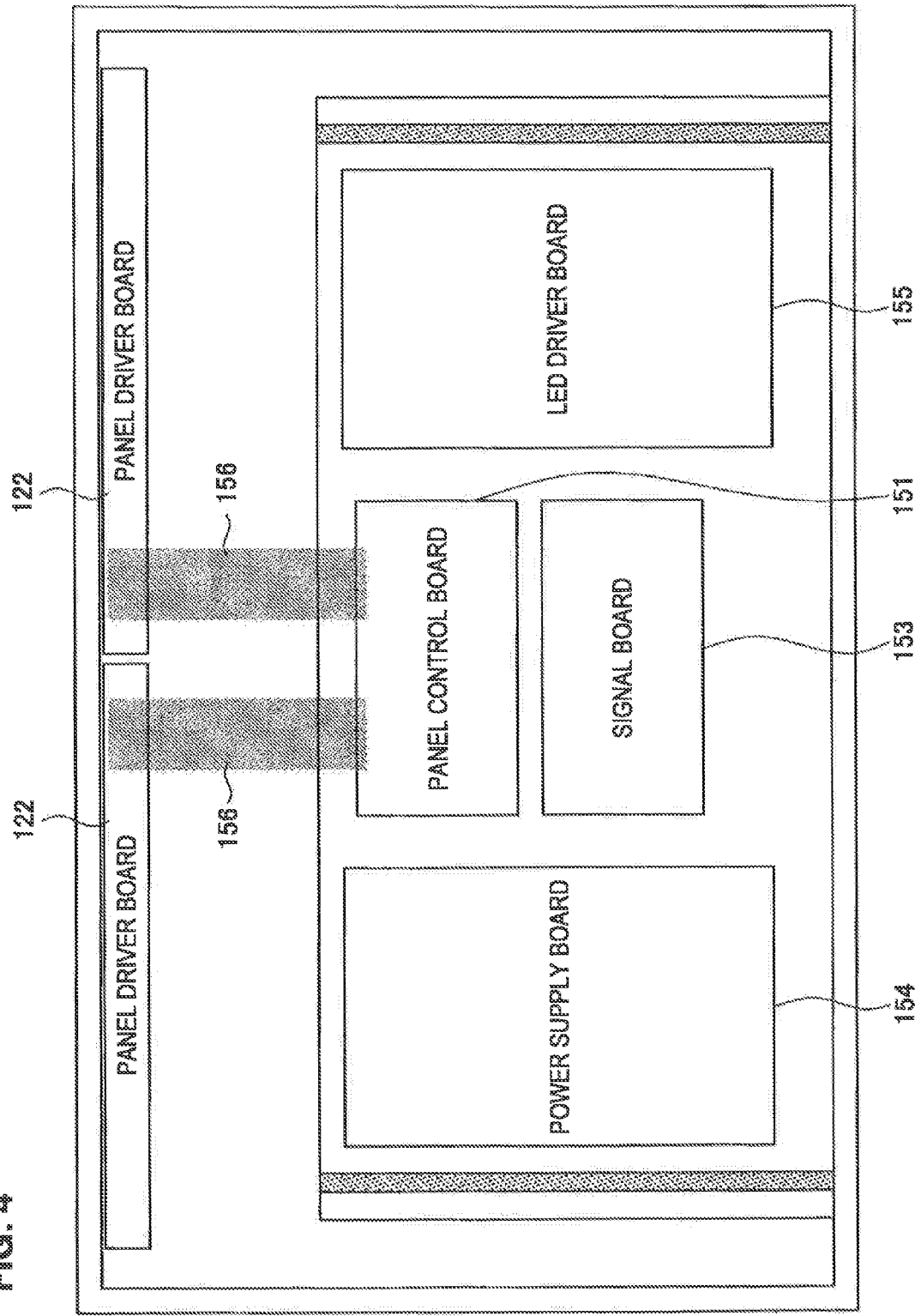
FIG. 4 is an explanatory diagram illustrating an overview of an arrangement of boards in the liquid crystal display apparatus 100 according to an embodiment of the present invention.

FIG. 4 is an explanatory diagram illustrating the overview of the arrangement of boards in the liquid crystal display apparatus 100 according to the embodiment of the present invention. The overview of the arrangement of boards in the liquid crystal display apparatus 100 according to the embodiment of the present invention will be explained with reference to FIG. 4.

As shown in FIG. 4, the liquid crystal display apparatus 100 according to the embodiment of the present invention includes a panel control board 151, panel driver boards 122, a signal board 153, a power supply board 154, and an LED driver board 155. These boards are arranged as shown in FIG. 4.

Among the boards shown in FIG. 4, the panel control board 151, the signal board 153, the power supply board 154, and the LED driver board 155 are mounted on the chassis 108. The panel control board 151 is mounted at the central portion of the back surface of the liquid crystal display apparatus 100, and is connected to the panel driver board 122 via a flexible board 156.

An overview of a board arrangement in the liquid crystal display apparatus 100 according to the embodiment of the present invention has been hereinabove explained. Subsequently, the configurations of the light sources 112, the optical waveguide 114, and the reflecting plate 115 in the liquid crystal display apparatus 100 according to the embodiment of the present invention will be explained.

Figure 5:
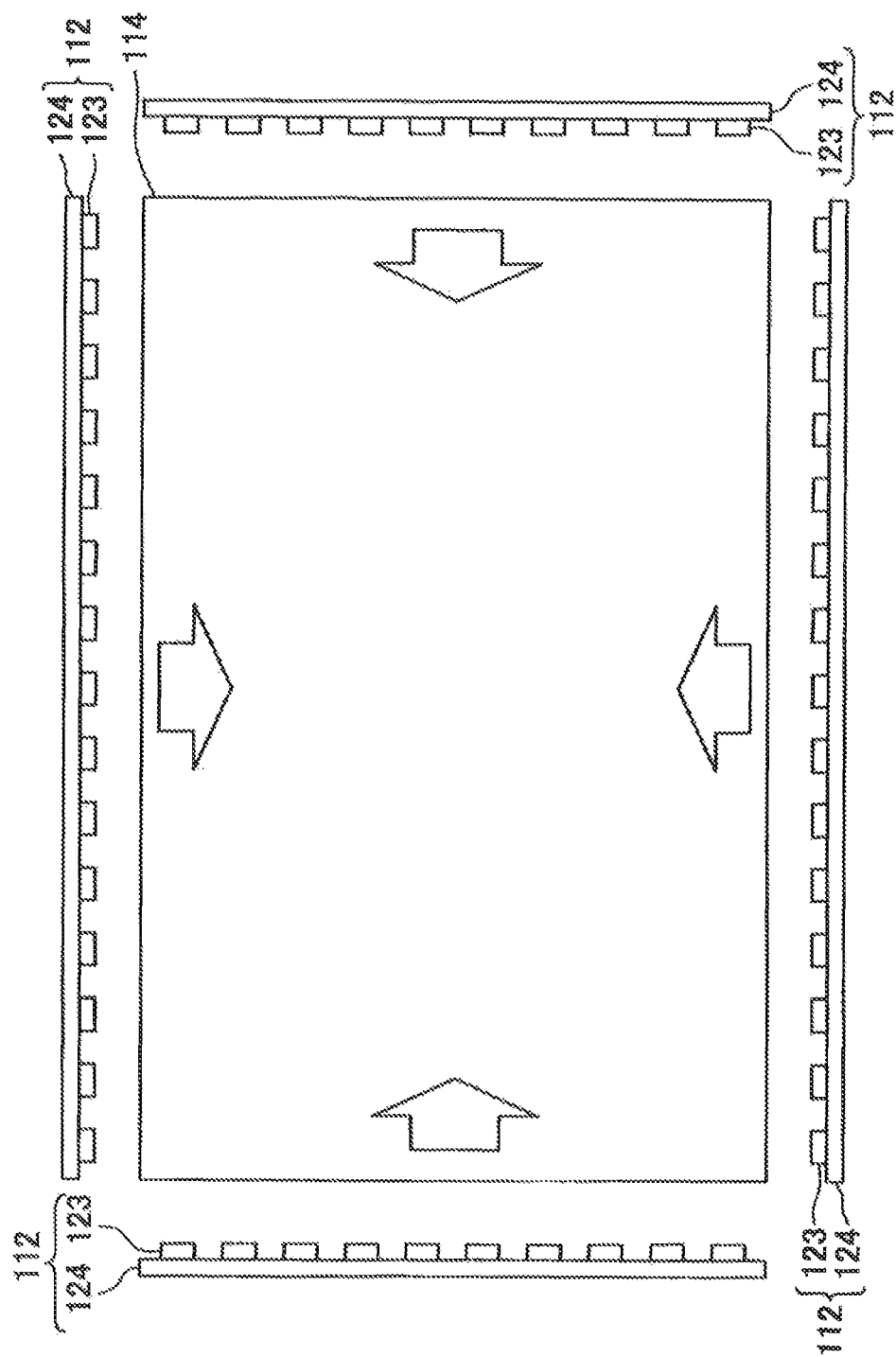
FIG. 5 is an explanatory diagram illustrating an arrangement of light sources 112, an optical waveguide 114, and a reflecting plate 115.
Figure 6:
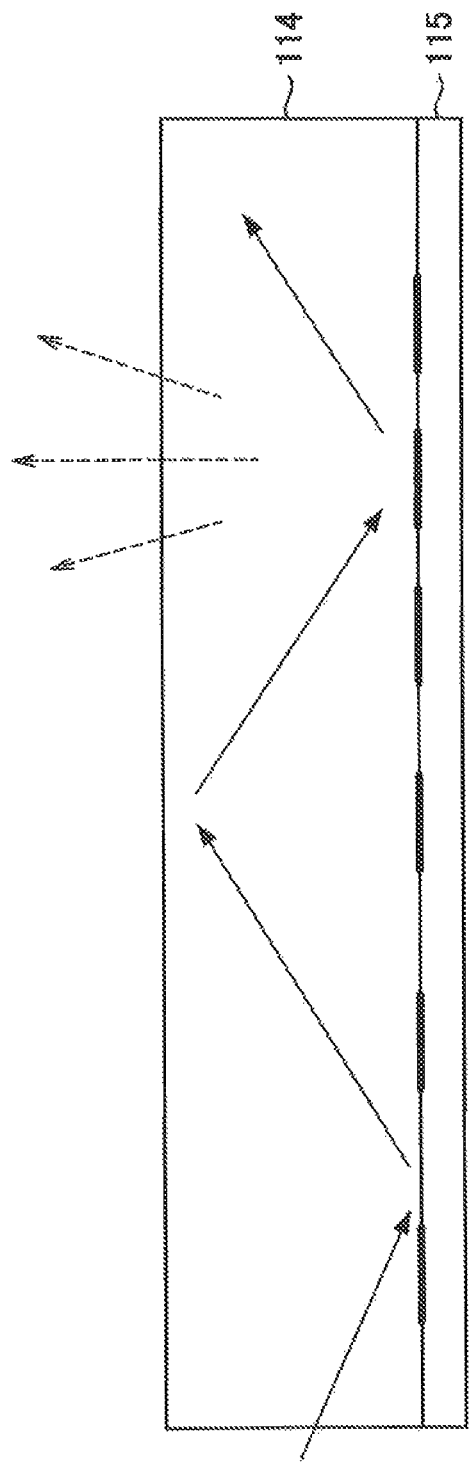
FIG. 6 is an explanatory diagram illustrating an arrangement of the light sources 112, the optical waveguide 114, and the reflecting plate 115.

FIGS. 5 and 6 are explanatory diagrams illustrating an arrangement of the light sources 112, the optical waveguide 114, and the reflecting plate 115 in the liquid crystal display apparatus 100 according to the embodiment of the present invention. The light sources 112, the optical waveguide 114, and the reflecting plate 115 in the liquid crystal display apparatus 100 according to the embodiment of the present invention will be explained will be hereinafter explained with reference to FIGS. 5 and 6.

FIG. 5 is the diagram illustrating the light sources 112 and the optical waveguide 114 as seen from the front surface side of the liquid crystal display apparatus 100. FIG. 6 is the diagram illustrating the cross sections of the light source 112, the optical waveguide 114, and the reflecting plate 115 as seen from the side surface of the liquid crystal display apparatus 100.

As shown in FIG. 5, the light sources 112 are arranged at positions along each side of the optical waveguide 114. Each of the light sources 112 includes a plurality of LEDs 123 for emitting white lights and an LED circuit board 124 for driving the LEDs 123. For example, the LED circuit board 124 may be a glass epoxy substrate or a metal core substrate such as aluminum, and have a substantially rectangular shape. The LED circuit board 124 may be formed in a thin plate form.

In the light source 112 according to the present embodiment, the LEDs 123 are arranged substantially in one row in a longitudinal direction on the LED circuit board 124. When the LED circuit board 124 receives a light emission instruction from the LED driver board 155, the LED circuit board 124 controls the LEDs 123 so as to cause the LEDs 123 to emit lights, and thus the LEDs 123 emit white lights. The LEDs 123 can emit the white lights to the optical waveguide 114. The optical waveguide 114 diffuses the white lights emitted by the LEDs 123 included in the light sources 112, and emits the diffused white lights to the display panel 102.

In order to efficiently diffuse the white lights emitted by the light source 112 and emit the diffused white lights to the display panel 102, the diffusion material is printed on the back surface side of the optical waveguide 114, and the reflecting plate 115 is arranged on the back surface side of the optical waveguide 114 as shown in FIG. 6. Since the diffusion material is printed on the back surface side of the optical waveguide 114 and the reflecting plate 115 is arranged on the back surface side of the optical waveguide 114 as described above, the white lights emitted by the light sources 112 can be efficiently diffused, and the diffused white lights can be emitted onto the display panel 102.

In FIG. 6, the diffusion material is printed on the back surface side of the optical waveguide 114 and the reflecting plate 115 is arranged on the back surface side of the optical waveguide 114 in order to efficiently diffuse the white lights emitted by the light sources 112. However, the present invention is not limited to these examples. For example, a reflecting shape may be formed on the back surface side of the optical waveguide so as to reflect the white lights emitted by the light sources. FIG. 7 is an explanatory diagram illustrating an optical waveguide 114' having the reflecting shape formed on the back surface side. When the back surface of the optical waveguide 114' is formed in the appropriate shape as shown in FIG. 7, the white lights emitted by the light sources 112 can be efficiently diffused, and the diffused white lights can be emitted onto the display panel 102.

In FIGS. 5 and 6, the LEDs 123 are arranged in one row on the light source 112. However, it is to be understood that the arrangement of the LEDs is not limited to such an example in the present invention. The arrangement of the LEDs may be changed as necessary according to the size of the display panel or the properties of the LEDs used as the light sources.

The configurations of the light sources 112, the optical waveguide 114, and the reflecting plate 115 in the liquid crystal display apparatus 100 according to the embodiment of the present invention has been hereinabove explained. Subsequently, the heat radiation structure for radiating heat generated by the light sources 112 according to an embodiment of the present invention will be explained.

[2] EXPLANATION ABOUT HEAT RADIATION STRUCTURE IN THE LIQUID CRYSTAL DISPLAY APPARATUS ACCORDING TO THE EMBODIMENT OF THE PRESENT INVENTION

In the present embodiment, the LEDs for emitting white lights can be used as the light sources 112. In the light source 112 as shown in FIG. 5, when the size of the screen becomes larger, i.e., when the size of the display panel 102 becomes larger, it is necessary to increase the number of LEDs 123 per one row of the light source 112 in order to emit lights to the entire display panel 102. Accordingly, as the size of the screen becomes larger, the heat generated by the LEDs 123 increases. Thus, the light source 112 is an example of light source according to the present invention.

Therefore, in order to prevent heat from being accumulated in the liquid crystal display apparatus 100, the liquid crystal display apparatus 100 has to efficiently discharge the heat generated by the LEDs 123 and suppress the rise of the temperature in the inside.

Accordingly, in the present embodiment, the heat generated by the light sources 112 is absorbed by a heat sink, and further, the heat absorbed by the heat sink is discharged via the front bezel 104 and the rear cover 106. Therefore, the present embodiment is characterized in efficiently discharging the heat generated by the LEDs 123 of the light sources 112.

FIG. 8 is an explanatory diagram illustrating a cross sectional diagram of a configuration of a heat radiation structure for radiating heat generated by the light sources 112 according to an embodiment of the present invention. The configuration of the heat radiation structure for radiating heat generated by the light sources 112 according to the embodiment of the present invention will be explained hereinafter with reference to FIG. 8. In FIG. 8 an upper side of the figure is the front surface side of the liquid crystal display apparatus 100, a lower side of the figure is the back surface side of the liquid crystal display apparatus 100.

FIG. 8 shows not only the configuration of the heat radiation structure for radiating heat generated by the light sources 112 but also the optical waveguide 114, the optical sheet 117, and the display panel 102. As shown in FIG. 8, the optical sheet 117 is arranged on the front surface side of the optical waveguide 114. As shown in FIG. 8, the light sources 112 are arranged at side surfaces of the optical waveguide 114, and the lights from the light sources 112 are emitted onto the side surfaces of the optical waveguide 114.

The optical sheet 117 is a sheet for exerting various kinds of optical functions on the lights emitted by the light sources 112 onto the display panel 102 through the optical waveguide 114. The optical sheet 117 may be made by laminating a plurality of optical sheets achieving various kinds of optical functions such as a functional sheet for decomposing display light incident to the display panel 102 from the LEDs 123 into a polarization component perpendicular to the incident light, a functional sheet for compensating a phase difference of lightwave to widen viewing angle and prevent coloring, or a functional sheet for diffusing the display light.

As shown in FIG. 8, the display panel 102 includes polarization plates 161, 164 and glass substrates 162, 163. The glass substrates 162, 163 are formed to receive voltages applied by the panel driver board 122 although this is not specifically shown in FIG. 8. For example, the glass substrate 163 on the back surface side may be formed with signal lines and scanning lines arranged in a matrix form, thin-film transistors serving as switching devices arranged at intersecting points between the signal lines and the scanning lines, and pixel electrodes. On the other hand, for example, the glass substrate 162 on the front surface side may be formed with a counter electrode and a color filter.

As described above, the liquid crystal layer is formed between the glass substrates 162 and 163 by sealing liquid crystals between the glass substrates 162 and 163. The orientation states of the liquid crystal molecules in the liquid crystal layer formed between the glass substrates 162 and 163 are changed by applying voltages with the panel driver board 122. The polarization plate 161 arranged at the front surface side of the glass substrate 162 and the polarization plate 164 arranged at the back surface side of the glass substrate 163 can pass only lights having the same oscillation direction as the polarization direction of the polarization plates 161, 164.

As shown in FIG. 8, in the liquid crystal display apparatus 100 according to the present embodiment, the heat sink 130 is adhered to a surface of the LED circuit board 124 opposite to the LEDs 123. The heat sink 130 is preferably made of a metal having a good thermal conductivity. For example, the heat sink 130 may be made by casting an aluminum block. It is to be understood that the shape of the heat sink 130 is not limited to the shape as shown in FIG. 8.

The heat sink 130 is arranged along each side of the display panel 102 corresponding to the light sources 112. Therefore, in a case where the light source 112 is arranged at only one side of the display panel 102, the heat sink 130 is arranged only at the side at which the light source 112 is arranged.

In this case, the LED circuit board 124 and the heat sink 130 may be adhered with a thermal conducting material having a high thermal conductivity. The thermal conducting material having a high thermal conductivity may be a double-sided adhesive tape made of a material having a high thermal conductivity.

As shown in FIG. 8, in the liquid crystal display apparatus 100 according to the present embodiment, the back surface side of the heat sink 130 and the front surface side of the rear cover 106 are adhered to each other. Therefore, the heat sink 130 and the rear cover 106 may be adhered with a thermal conducting material having a high thermal conductivity in the same manner as adhesion between the LED circuit board 124 and the heat sink 130. In this case, the thermal conducting material having a high thermal conductivity used for the adhesion between the LED circuit board 124 and the heat sink 130 may be a double-sided adhesive tape made of a material having a high thermal conductivity. As describe above, the heat sink 130 and the rear cover 106 are adhered to each other, whereby the heat absorbed by the heat sink 130 is transmitted to the rear cover 106, and the heat transmitted to the rear cover 106 can be discharged from the surface of the rear cover 106.

For example, as shown in FIG. 8, the heat sink 130 may be formed in such a shape that the width of the surface facing the rear cover 106 is larger than the width of the surface facing the LED circuit board 124 in order to efficiently discharge the heat generated by the LEDs 123. When the heat sink 130 is formed such that the width of the surface facing the rear cover 106 is larger, the heat absorbed from the LEDs 123 can be efficiently transmitted to the rear cover 106.

Further, as shown in FIG. 8, the liquid crystal display apparatus 100 according to the present embodiment has a middle chassis 131 at the front surface side of the heat sink 130. For example, the middle chassis 131 may be formed with a material having a low thermal conductivity than metal. As an example of the material, a synthetic resin may be used to mold the middle chassis 131. As shown in FIG. 8, the middle chassis 131 is arranged between the front bezel 104 and the heat sink 130.

As described above, the heat absorbed by the heat sink 130 is transmitted to the rear cover 106, and the heat transmitted to the rear cover 106 can be discharged from the surface of the rear cover 106. However, the heat absorbed by the heat sink 130 is also transmitted to the middle chassis 131, and the heat can also be discharged from the front bezel 104.

When the middle chassis 131 is formed with a material having a thermal conductivity lower than that of the heat sink 130, the heat is less likely to be transmitted from the heat sink 130 to the front bezel 104 compared with the heat transmitted from the heat sink 130 to the rear cover 106 due to the low thermal conductivity of the middle chassis 131. Therefore, when the middle chassis 131 is formed with a material having a thermal conductivity lower than that of the heat sink 130, the amount of heat discharged from the front bezel 104 is less than the amount of heat discharged from the rear cover 106.

Therefore, when the middle chassis 131 is formed with a material having a thermal conductivity lower than that of the heat sink 130, the temperature of the front bezel 104 increases less rapidly than the rear cover 106. Thus, the heat generated by the light sources 112 can be efficiently discharged from the back surface side of the liquid crystal display apparatus 100 while the increase of the temperature on the front surface side of the liquid crystal display apparatus 100 is suppressed.

In the past, there is a display apparatus having an air layer for discharging heat generated by light sources. In contrast, in the liquid crystal display apparatus 100 according to the present embodiment, the heat sink 130 is in close contact with the rear cover 106 and the middle chassis 131 without any air layer therebetween as shown in FIG. 8. Therefore, the liquid crystal display apparatus 100 according to the present embodiment can contribute to the reduction of the thickness.

When the heat radiation structure is arranged as described above, it is not necessary to arrange a fan for discharging the heat. Therefore, the liquid crystal display apparatus 100 according to the present embodiment does not generate any noise at all, which would be caused by the fan when the fan discharges the heat. Since the liquid crystal display apparatus 100 according to the present embodiment does not use the fan for discharging the heat, no electric power is necessary to drive the fan. As a result, the liquid crystal display apparatus 100 according to the present embodiment consumes a smaller amount of electric power.

As described above, the back surface side of the rear cover 106 (i.e., the surface of the rear cover 106) may be coated with rubber. The rubber coating produces an effect of reducing the sensible temperature when the rubber coating is touched by a hand. In the liquid crystal display apparatus 100 according to the present embodiment, a larger amount of heat is transmitted to the rear cover 106, which increases the temperature of the rear cover 106. Accordingly, the surface of the rear cover 106 is coated with rubber, which can reduce the sensible temperature when the rubber coating is touched by a hand.

As described above, the liquid crystal display apparatus 100 according to the present embodiment has a circuit arrangement as shown in FIG. 4. In the liquid crystal display apparatus 100 according to the present embodiment, the light sources 112 are arranged at positions along each side of the display panel 102. Therefore, the temperature at a peripheral portion rises due to the heat generated by the light sources 112, but an inner part of the peripheral portion of the liquid crystal display apparatus 100 is hardly affected by the heat generated by the light sources 112.

Therefore, in the liquid crystal display apparatus 100 according to the present embodiment, the boards for driving the liquid crystal display apparatus 100 are arranged in the inner part of the peripheral portion of the liquid crystal display apparatus 100, and the heat generated by the boards is discharged from the chassis 108 as shown in FIG. 4. Therefore, since the boards are arranged in the inner part of the peripheral portion of the liquid crystal display apparatus 100 in the liquid crystal display apparatus 100 as shown in FIG. 4, the heat generated in the inside of the liquid crystal display apparatus 100 can be discharged in an overall well-balanced manner.

The configuration of the heat radiation structure for radiating the heat generated by the light sources 112 according to the embodiment of the present invention has been hereinabove explained.

[3] EXPLANATION ABOUT STRUCTURE OF LIQUID CRYSTAL DISPLAY APPARATUS ACCORDING TO THE EMBODIMENT OF THE PRESENT INVENTION

Subsequently, the shape of the rear cover 106 in the liquid crystal display apparatus 100 according to the embodiment of the present invention will be explained.

Figure 9A:
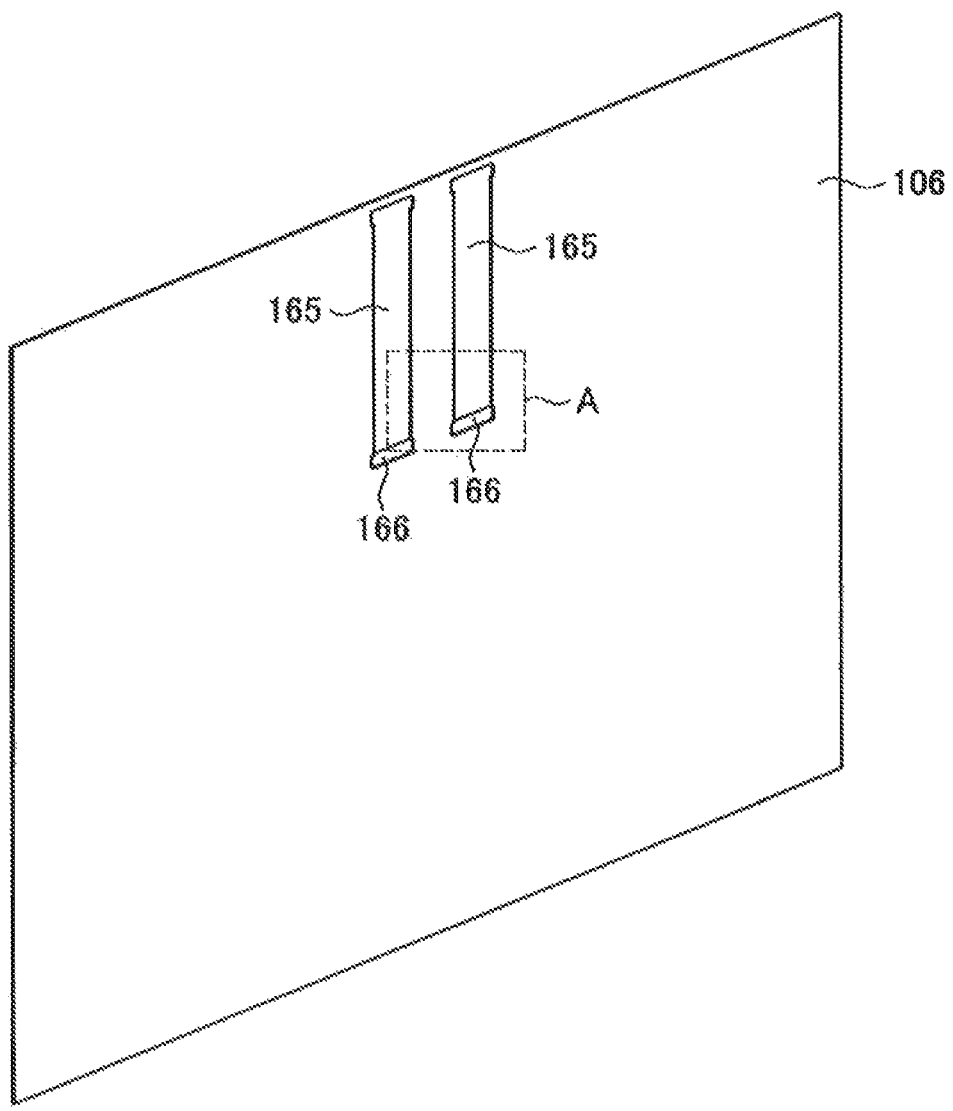
FIG. 9A is an explanatory diagram illustrating a shape of a rear cover 106 in the liquid crystal display apparatus 100 according to an embodiment of the present invention.

FIGS. 9A to 9C are explanatory diagrams each illustrating a shape of a rear cover 106 in the liquid crystal display apparatus 100 according to the embodiment of the present invention. The shape of the rear cover 106 according to the embodiment of the present invention will be explained with reference to FIGS. 9A to 9C.

As described above, the panel control board 151 is mounted on the central portion of the hack surface of the liquid crystal display apparatus 100, and is connected to the panel driver hoard 152 via the flexible board 156. However, when the circuit boards are arranged on the hack surface of the display panel, it is necessary to prevent unwanted emissions generated by the circuit boards from being radiated from the front surface side of the liquid crystal display apparatus 100.

Accordingly, in the liquid crystal display apparatus 100 according to the present embodiment, recessed portions having indentations are formed in portions of the rear cover 106, and the flexible boards 156 are placed in the recessed portions, so that it is less likely to be affected by unwanted emissions generated by the circuit boards.

FIG. 9A is an explanatory diagram illustrating, as a perspective view seen from the front surface side, the rear cover 106 arranged with recessed portions 165 having indentations in the liquid crystal display apparatus 100 according to the present embodiment. FIG. 9B is an enlarged explanatory diagram illustrating the rear cover 106 arranged with the recessed portions 165 having indentations in the liquid crystal display apparatus 100 according to the present embodiment. It should be noted that FIG. 9B is an enlarged view of a portion indicated by a reference mark A in FIG. 9A. FIG. 9C is an explanatory diagram illustrating a cross sectional shape of the rear cover 106 arranged with recessed portions 165 having indentations in the liquid crystal display apparatus 100 according to the present embodiment.

As shown in FIGS. 9A to 9C, the recessed portions 165 having indentations are arranged on the rear cover 106, and the flexible board 156 connecting between the panel control board 151 and the panel driver board 122 mounted on the chassis 108 is placed in the recessed portion 165. As described above, the flexible boards 156 are placed in the recessed portions 165, so that unwanted emissions from the flexible boards 156 can be reduced. Since the indentations are thus arranged and the flexible boards 156 are placed in the recessed portions 165, the thickness of the liquid crystal display apparatus 100 can be reduced.

Moreover, since the rear cover 106 is arranged with the recessed portions 165 having the indentations as described above, the flexible boards 156 can be placed in the indentations at the back surface side of the reflecting plate 115, and the thicknesses of the optical waveguide 114 and the reflecting plate 115 are not affected in the portions where the flexible boards 156 are placed. Therefore, the lights emitted by the light sources 112 are not optically affected in the portions where the flexible boards 156 are placed.

The rear cover 106 may be arranged with holes 166 through which the flexible boards 156 are passed. FIGS. 9A and 9B show holes 166 arranged at lower portions of the recessed portions 165, wherein the flexible boards 156 are passed through the holes 166 from the back surface side. It is to be understood that the shape of the hole through which the flexible board 156 is passed is not limited to the shape as shown in FIGS. 9A and 9B.

The shape of the rear cover 106 in the liquid crystal display apparatus 100 according to the present embodiment of the present invention has been hereinabove explained. Subsequently, a shape of the peripheral portion of the front bezel 104 in the liquid crystal display apparatus 100 according to the embodiment of the present invention will be explained.

Figure 10A:
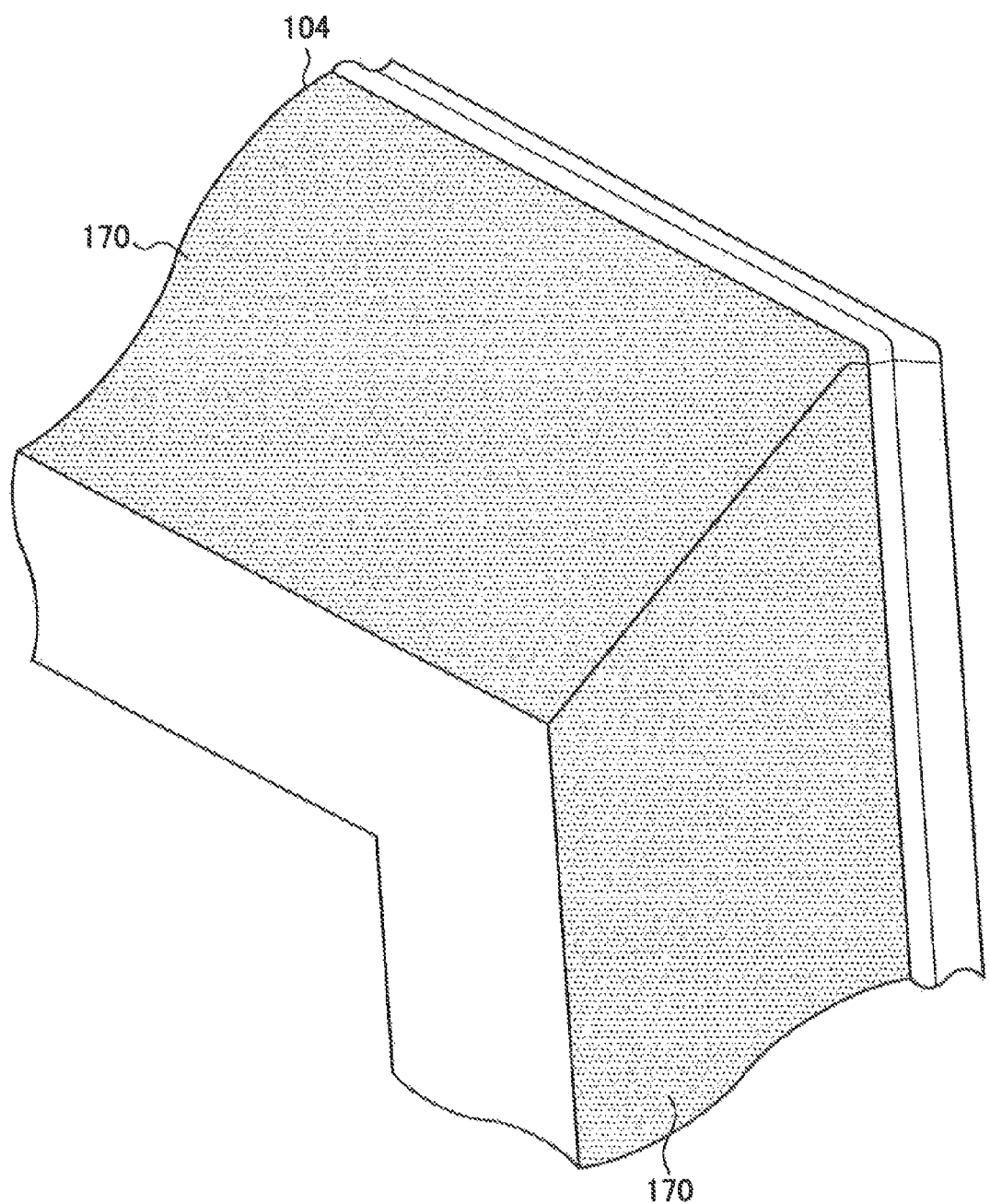
FIG. 10A is an explanatory diagram illustrating, as a perspective view, a shape of a peripheral portion of a front bezel 104 in the liquid crystal display apparatus 100 according to an embodiment of the present invention.

FIG. 10A is an explanatory diagram illustrating, as a perspective view, the shape of the peripheral portion of the front bezel 104 in the liquid crystal display apparatus 100 according to the embodiment of the present invention. FIGS. 10B and 10C are explanatory diagrams each illustrating cross sectional shapes of the front bezel 104 and the rear cover 106 in the liquid crystal display apparatus 100 according to the embodiment of the present invention.

As shown in FIGS. 10A to 10C, in liquid crystal display apparatus 100 according to the embodiment of the present invention, the peripheral portion of the back surface side of the front bezel 104 is formed with a tapered portion 170. The tapered portion 170 has a predetermined inclination from the front surface side to the back surface side so as to make the hack surface side smaller. Since the front bezel 104 is formed with the tapered portion 170 having the predetermined inclination from the front surface side to the back surface side so as to make the back surface side smaller as shown in FIGS. 10A to 10C, the liquid crystal display apparatus 100 produces a visual effect of appearing to be thinner when the liquid crystal display apparatus 100 is seen from the front while the rigidity of the front bezel 104 is maintained.

As shown in FIG. 10C, the front bezel 104 and the rear cover 106 may be engaged by a screw 171 with a spacer 172 interposed between the front bezel 104 and the rear cover 106. It is to be understood that the structure for engaging the front bezel 104 and the rear cover 106 is not limited to such an example. Further, the material of the spacer 172 is not limited to any predetermined material.

The inclination of the tapered portion 170 is not limited to what are shown in FIGS. 10A to 10C. An appropriate inclination can be defined in view of a relationship between the above visual effect and the rigidity of the front bezel 104.

The shape of the peripheral portion of the front bezel 104 in the liquid crystal display apparatus 100 according to the embodiment of the present invention has been hereinabove explained. Subsequently, a connection structure between the chassis 108 and the stand 110 in the liquid crystal display apparatus 100 according to the embodiment of the present invention will be explained.

Figure 11:
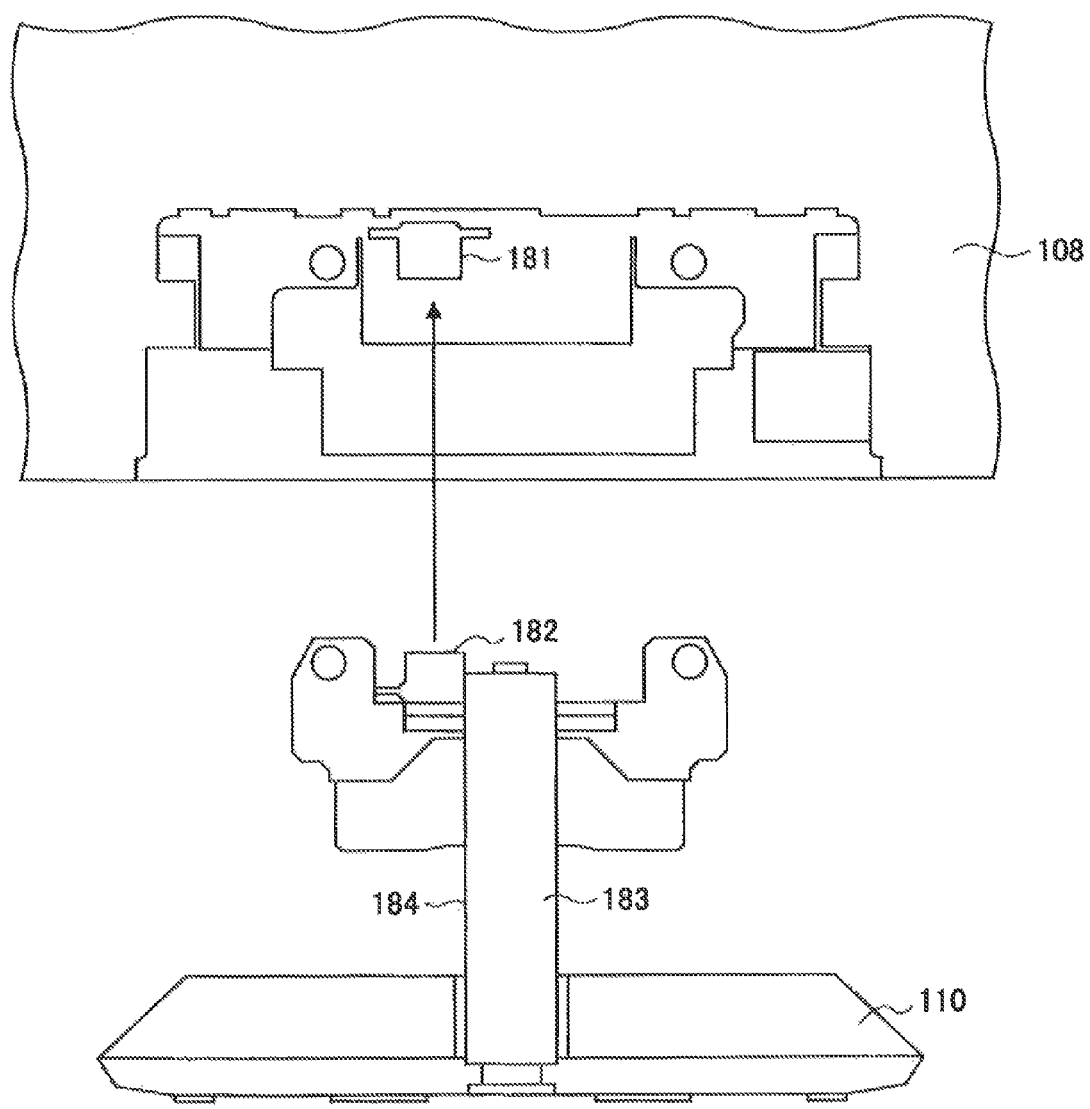
FIG. 11 is an explanatory diagram illustrating a connection structure between a chassis 108 and a stand 110 in the liquid crystal display apparatus 100 according to an embodiment of the present invention.
Figure 12:
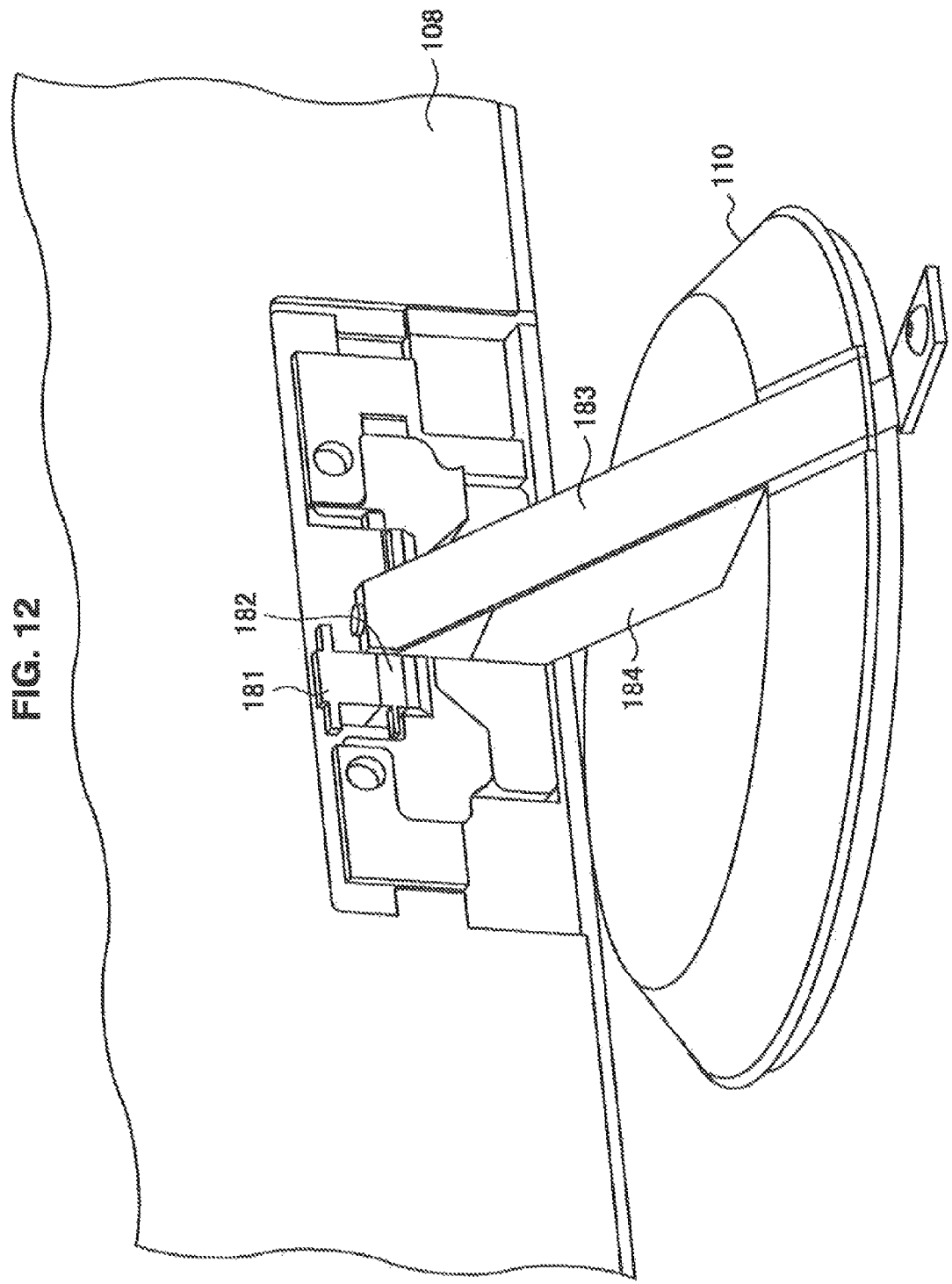
FIG. 12 is an explanatory diagram illustrating a connection structure between the chassis 108 and the stand 110 in the liquid crystal display apparatus 100 according to an embodiment of the present invention.

FIG. 11 is an explanatory diagram illustrating, as seen from the back surface side of the liquid crystal display apparatus 100, the chassis 108 and the stand 110 of the liquid crystal display apparatus 100 according to the embodiment of the present invention. In FIG. 11, the chassis 108 and the stand 110 have not yet been connected with each other. FIG. 12 is an explanatory diagram illustrating, as a perspective view seen from the back surface side of the liquid crystal display apparatus 100, the chassis 108 and the stand 110 of the liquid crystal display apparatus 100 according to the embodiment of the present invention. In FIG. 12, the chassis 108 and the stand 110 are connected with each other.

As shown FIGS. 11 and 12, in the liquid crystal display apparatus 100 according to the embodiment of the present invention, the chassis 108 is arranged with a connector 181, and the stand 110 is arranged with a connector 182. When the connectors 181, 182 are connected as shown in FIG. 12, the chassis 108 is connected to the stand 110.

When the chassis 108 is connected to the stand 110, the connectors 181, 182 cause the chassis 108 and the stand 110 to be electrically connected with each other. When the connectors 181, 182 cause the chassis 108 and the stand 110 to be electrically connected with each other, a speaker (not shown) incorporated into the stand 110 can output audio.

The stand 110 may be arranged with a cover. For example, as shown in FIG. 12, a cover 183 may be arranged on the arm section 184 of the stand 110 in an openable and closable manner. When the cover 183 is arranged in an openable and closable manner, power supply cables and other cables can be accommodated in the arm section 184.

The connection structure between the chassis 108 and the stand 110 in the liquid crystal display apparatus 100 according to the embodiment of the present invention has been hereinabove explained.

[4] CONCLUSION

As described above, according to the liquid crystal display apparatus 100 according to the embodiment of the present invention, the heat generated by the light sources 112 is absorbed by the heat sink 130 made of a metal having a high thermal conductivity and as high degree of formability such as aluminum. Then, the heat absorbed by the heat sink 130 is transmitted to the rear cover 106 made of a metal having a high thermal conductivity and a high degree of formability such as aluminum, and is discharged from the rear cover 106. Thus, since the heat generated by the light sources 112 is transmitted as described above, the liquid crystal display apparatus 100 can efficiently discharge the heat generated by the light sources 112 without arranging any heat radiation structure such as a fan or fins.

According to the liquid crystal display apparatus 100 according to the embodiment of the present invention, the heat absorbed by the heat sink 130 can also be discharged from the front bezel 104, but the middle chassis 131 is arranged between the heat sink 130 and the front bezel 104. The middle chassis 131 may be formed with a material having a thermal conductivity lower than that of the heat sink 130, such as a synthetic resin.

Since the middle chassis 131 is formed with a material having a thermal conductivity lower than that of the heat sink 130, the amount of heat transmitted to the front bezel 104 is less than the amount of heat transmitted to the rear cover 106. Therefore, the amount of heat discharged from the front bezel 104 is less than the amount of heat discharged from the rear cover 106, and the temperature of the front surface side of the liquid crystal display apparatus 100 can be prevented from significantly increasing.

The preferred embodiments of the present invention have been described above with reference to the accompanying drawings, whilst the present invention is not limited to the above examples, of course. A person skilled in the art may find various alternations and modifications within the scope of the appended claims, and it should be understood that they will naturally come under the technical scope of the present invention.

For example, in the above embodiment, the liquid crystal display apparatus using liquid crystal has been explained as an example of a display apparatus. However, the present invention is not limited to such an example. For example, it is to be understood that the present invention can be applied to a display apparatus having heat sources arranged along each side of a display panel.

The present invention can be applied to a display apparatus.

The invention claimed is:

1. A display apparatus comprising:
a display panel for displaying an image;
a heat source arranged at a side surface of at least one side of the display panel;
a heat absorbing section for absorbing heat generated by the heat source;
a back surface plate arranged at a back surface side of the display panel and made of a first metal, wherein a portion of the back surface plate is in close contact with the heat absorbing section;
a front surface plate arranged at a front surface side of the display panel and made of a second metal; and
a middle chassis arranged between the front surface plate and the heat absorbing section,
in which the middle chassis is made of a non-metal material having a thermal conductivity lower than a thermal conductivity of the heat absorbing section to suppress heat generated by the heat source from being discharged from the front surface plate such that when the generated heat is absorbed by the heat absorbing section an amount of heat discharged from the front surface plate is less than that discharged from the back surface plate.

2. The display apparatus according to claim 1, further comprising at least one of a panel control board, a panel driver board, and a flexible board.

3. The display apparatus according to claim 1, wherein the middle chassis is made a material comprising synthetic resin.

4. The display apparatus according to claim 1, further comprising:
a plurality of heat sources emitting visible light; and
a light radiation unit for diffusing the light emitted by the plurality of heat sources to radiate the diffused light onto the display panel, thus displaying an image on the display panel.

5. The display apparatus according to claim 4, wherein the plurality of heat sources are arranged at positions along at least one side of the display panel.

6. The display apparatus according to claim 4, wherein the light radiation unit comprises a back surface on which diffusion material is printed.

7. The display apparatus according to claim 4, wherein the light radiation unit is made of a material comprising silicone rubber resin.

8. The display apparatus according to claim 4, wherein the light radiation unit further performs at least one of a process of decomposing display light incident to the display panel and a process of compensating a phase difference of a lightwave.

9. The display apparatus according to claim 1, wherein the display panel comprises two glass substrates and two polarization plates.

10. The display apparatus according to claim 9, further comprising a panel driver board, wherein the two glass substrates receive voltages applied by the panel driver board.

11. The display apparatus according to claim 9, wherein the two glass substrates are sealed between the two polarization plates.

12. The display apparatus according to claim 9, wherein the display panel further comprises a liquid crystal layer, the liquid crystal layer being formed between the two glass substrates.

13. The display apparatus according to claim 12, wherein orientation states of the liquid crystal layer are changed by applying voltages with the panel driver board.

14. A display apparatus comprising:
a display panel for displaying an image;
a heat source arranged at a side surface of at least one side of the display panel;
a heat absorbing section for absorbing heat generated by the heat source;
a back surface plate arranged at a back surface side of the display panel and made of a first metal, wherein a portion of the back surface plate is in close contact with the heat absorbing section;
a front surface plate arranged at a front surface side of the display panel and made of a second metal; and
a middle chassis arranged between the front surface plate and the heat absorbing section,
wherein a peripheral portion of the back surface side of the front surface plate is formed with a tapered portion.

15. The display apparatus according to claim 1, in which an outer or exterior surface of the back surface plate is coated with rubber.

\* \* \* \* \*